United States Patent [19]
Bialobrodski et al.

[11] Patent Number: 5,861,759
[45] Date of Patent: Jan. 19, 1999

[54] AUTOMATIC PROBE CARD PLANARIZATION SYSTEM

[75] Inventors: Marian R. Bialobrodski; Marius R. Lupan, both of Danville, Calif.

[73] Assignee: Tokyo Electron Limited, Japan

[21] Appl. No.: 791,767

[22] Filed: Jan. 29, 1997

[51] Int. Cl.[6] .................................................. G01B 11/00
[52] U.S. Cl. .......................................... 324/758; 356/375
[58] Field of Search .............................. 324/758; 356/375

[56] References Cited

U.S. PATENT DOCUMENTS

| | | | |
|---|---|---|---|
| 4,751,457 | 6/1988 | Veenendaal | 324/758 |
| 4,786,867 | 11/1988 | Yamatsu | 324/758 |
| 4,864,227 | 9/1989 | Sato | 324/758 |
| 4,929,893 | 5/1990 | Sato et al. | 324/758 |
| 4,934,064 | 6/1990 | Yamaguchi et al. | 324/758 |
| 5,065,092 | 11/1991 | Sigler | 324/758 |
| 5,091,692 | 2/1992 | Ohno et al. | 324/758 |
| 5,394,100 | 2/1995 | Bohler et al. | 324/758 |
| 5,410,259 | 4/1995 | Fujihara et al. | 324/758 |
| 5,422,579 | 6/1995 | Yamaguchi | 324/758 |
| 5,510,723 | 4/1996 | Canella et al. | 324/758 |
| 5,642,056 | 6/1997 | Nakajima et al. | 324/758 |

OTHER PUBLICATIONS

*Patent Abstracts of Japan* (08162509 A) Jun. 21, 1996 "Probe Device and Prosing Method" Hitosh.i

*Primary Examiner*—Thomas P. Noland
*Attorney, Agent, or Firm*—Allston L. Jones

[57] ABSTRACT

The present invention provides an automatic probe card planarization system and method to planarize a first plane defined by a plurality of contact points of a probe card relative to a second plane defined by a top surface of a wafer supported on a prober, with the probe card intermediate the wafer and a tester with the probe card interfacing eclectically with the tester to test the performance of the wafer. The planarization is performed by interfacing the probe card to the wafer by individually interfacing three points fixed points on the tester with three points on the prober. On of the points on the prober being fixed, while the other two are height variable as a result of calculations by a processor. Additionally, a camera is used to measure the height of at least three selected contact points on the probe card relative to the plane of wafer, from which the position of the first plane relative to said second plane is calculated. With that information and the geometry of the prober and tester, the height variations necessary for the two height variable points on the prober are calculated and the height adjustments made to planarize the first plane relative to the second plane. Alternatively, the height adjustments can be included in the tester, or one in each of the tester and the prober.

11 Claims, 6 Drawing Sheets

AUTOMATIC PROBE CARD PLANARIZATION SYSTEM

FIELD OF THE INVENTION

The present invention relates to testers, probers and probe cards for substrates, typically semiconductor substrates, and more specifically to methods and apparatus to planarize the probe needles, so that each probe needle when brought into contact with the lead pads on a die, the pressure exerted by each probe needle on each lead pad is substantially equal.

BACKGROUND OF THE INVENTION

The problem that is currently facing the semiconductor industry is how to planarize a probe card to a wafer during testing of individual die on that wafer. If planarization is not achieved, then some probe needles apply more pressure to corresponding lead pads on the die, while others apply less. This at a minimum could result in incomplete electrical interfacing with the die so that the die tests bad, or at worst that the lead pads to which more pressure is applied are physically damaged making it impossible to use the die in a finished product.

What is currently done in the industry is to dock the tester with the prober, bringing the probe needles into contact with a test die on a single wafer or a single wafer in a cassette of wafers. The system is then undocked and the individual lead pads on the test die are optically examined to determine if more pressure has been applied to some lead pads on that die. This is done by looking for scratches and possibly indentations in the individual lead pads. Since the lengths of the probe needles are adjusted to be within 10 microns of each other, typically the greatest pressure will be applied to adjacent lead pads on one side of the test die and the least pressure will be applied to the lead pads that are 180° displaced from those that experienced the greatest pressure. Based on those observations, the operator makes an educated guess as to how much adjustment, and in what direction, is needed to planarize the probe card to the wafer. The probe card is then shimmed accordingly and the other dies on the wafer, or all wafers in the cassette, are tested. Thus, it is necessary to repeat this process each time the wafer, or cassette of wafers, is changed.

Also, since the planarization process in the prior art is performed when the test head is separated from the prober, there is no contact between the interface card, the pogo ring, the probe card, the probe needles and the wafer. Thus, when docking is achieved everything is changing due to internal stresses and moments, there is a high probability that the probe needles are changing position as well.

Of course, this process is aggravated by the fact that there is usually very little space between the prober and the test head. Thus, in the prior art, planarization is accomplished with the prober and test head un-docked. The prior art does not include a way to perform planarization after docking has been achieved.

To insure that the probe card and probe needles are planarized with the wafer after docking is achieved, a system is needed that performs planarization after docking has been achieved. The present invention provides such a system.

SUMMARY OF THE INVENTION

The present invention provides an automatic probe card planarization system and method to planarize a first plane defined by a plurality of contact points of a probe card relative to a second plane defined by a top surface of a wafer supported on a prober, with the probe card intermediate the wafer and a tester with the probe card interfacing eclectically with the tester to test the performance of the wafer. The planarization is performed by interfacing the probe card to the wafer by individually interfacing three points fixed points on the tester with three points on the prober. On of the points on the prober being fixed, while the other two are height variable as a result of calculations by a processor. Additionally, a camera is used to measure the height of at least three selected contact points on the probe card relative to the plane of wafer, from which the position of the first plane relative to said second plane is calculated. With that information and the geometry of the prober and tester, the height variations necessary for the two height variable points on the prober are calculated and the height adjustments made to planarize the first plane relative to the second plane. Alternatively, the height adjustments can be included in the tester, or one in each of the tester and the prober.

In the alternative, both height adjustments could be provided in the tester assembly. Yet another alternative is to provide one height adjustment in each of the prober and the tester. Still another alternative is to provide a portion of the height adjustment at one or more points in both the prober and the tester.

DESCRIPTION OF THE PRESENT INVENTION

Figure 1:
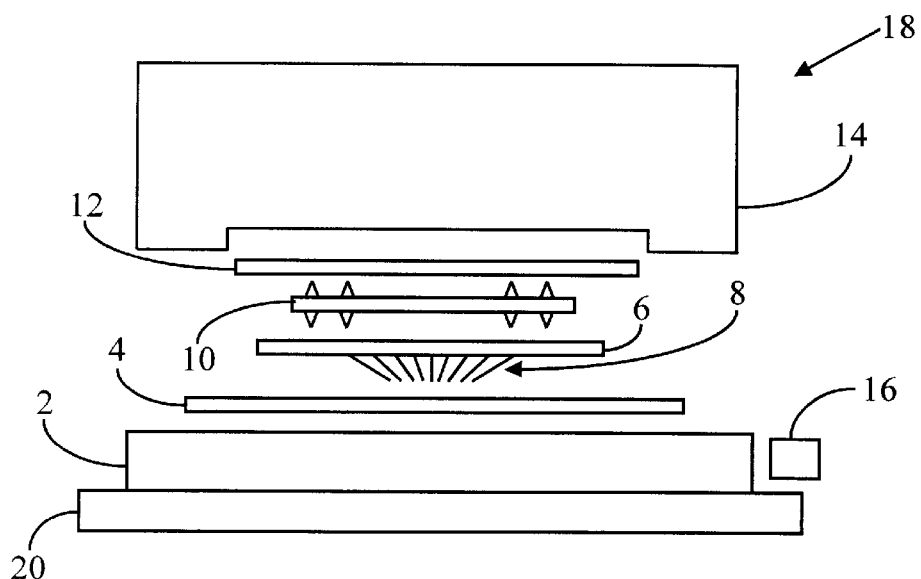
FIG. 1 is an exploded schematic side view of the major components of a system for conducting tests of semiconductor wafers.

FIG. 1 is a simplified, exploded diagram of the typical semiconductor tester/prober interface of the prior art and the present invention. Generally in the upper portion of the figure there is shown the components of tester 18, and in the lower portion of the figure there is shown the components of prober 20.

Beginning at the bottom of FIG. 1, prober 20 is shown to include stage 2 which is mounted on the top of the main portion of prober 20 with stage 2 disposed to receive semiconductor wafer 4 that may include multiple dies thereon that are to be tested. Continuing upward the next component that is shown is a probe card 6 with probe needles 8 that are collectively disposed to interface with a single die at a time on wafer 4. Each probe card 6 and the configuration of probe needles 8 is designed to correspond with the die type, shape and size on wafer 2 to be tested and the lead pad configuration of the individual die.

Referring now to the upper portion of FIG. 1, tester 18 is shown to include an interface board 12. The circuit configuration on the upper and lower sides of interface board 12 complement the terminals of test head 14 and probe card 6, respectively. Electrical connection is made between interface board 12 and probe card 6 when the prober and tester are docked with each other most commonly with a pogo ring 10 that includes double sided pogo pins. Pogo pins are made from a conductive material that are sharp pointed on each side, with each point being spring loaded relative to the surface from which that point extends. When docking occurs, each pogo pin is compressed from both sides.

Thus, what takes place when docking is achieved is that contact is made between probe needles 8 and each lead pad on a die of wafer 4 that is to be tested. In turn each of probe needles 8 is electrically connected to tester 18 via probe card 6, pogo pins 10 and interface card 12. Following the testing of one die, probe needles 8 are drawn away from wafer 4, wafer 4 is stepped to move another die beneath probe needles 8 and docking is again achieved. This process is then repeated for each die on wafer 4 until all of the dies on wafer 4 have been tested.

Figure 4:
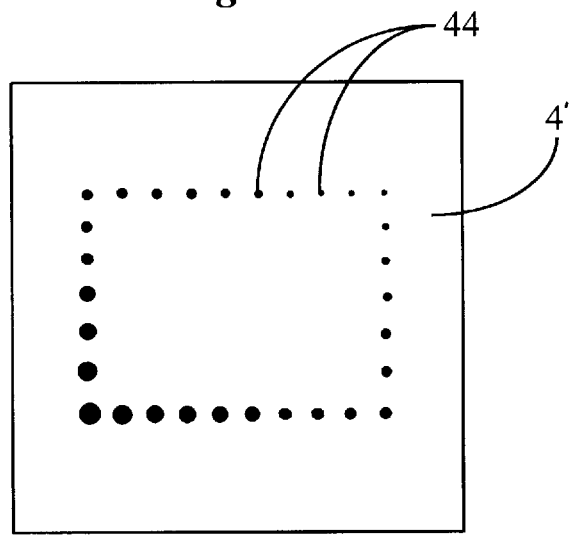
FIG. 4 illustrates the probe needle marks on the lead pads of a die when pressure is not equal across the die.

FIG. 4 shows a die 4' which was subjected to docking with the probe card not having been planarized with die 4'. Here a simplified lead pad pattern on die 4' is shown with lead pads 44 in a rectangular formation. It can be seen graphically here from the individual lead pad sizes that the probe needles that interfaced with the lead pads in the lower left quadrant applied greater pressure to those lead pads, while at the same time the probe needles that interfaced with the lead pads in the upper right quadrant (180° from those that experienced the greatest pressure) applied less pressure to those lead pads.

To more equally apply pressure to the lead pads, the present invention performs planarization of probe card 6 with wafer 4 after test head 18 is docked with prober 20. This is achieved through the use of a three point mounting system between test head 14 and prober 20 by making the height of two of the mounting points on the prober adjustable based on a measurement of the difference in height of selected ones of the probe needles on the probe card with respect to each other as will be seen from the discussion of FIG. 5 below.

Figure 2A:
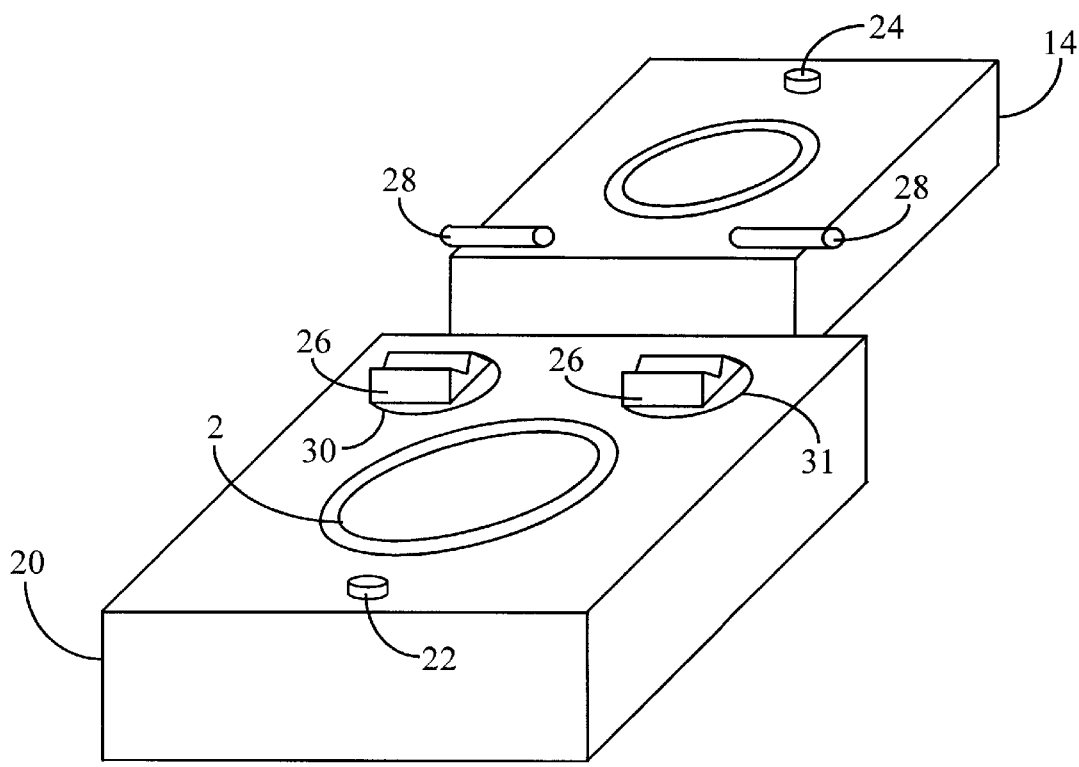
FIG. 2a–2d are simplified perspective views of several embodiments of the present invention interface between the chassis of a prober and a tester that incorporates the present invention.

In FIG. 2a the mechanical planarization interface of the present invention between prober 20 and test head 14 is illustrated. In this view test head 14 is shown upside down and behind prober 20 to disclose the mechanical mating features between the two units. On the top of prober 20 three mounting points are shown, a fixed prober mounting point 22 and two prober adjustable points 26 which are mounted on first and second lift actuators 30 and 31, respectfully.

Correspondingly, test head 14 includes a fixed mounting point 24 that is to rest on prober fixed mounting point 22, and two test head fixed rocker points 28 that are sized and shaped to mate with prober adjustable points 26.

In this view each of prober adjustable points 26 is shown as a "V" shaped saddle and test head fixed rocker points 28 are shown as cylindrical rod sections that are each sized to fit within the "V" shaped saddle of prober points 26. It needs to be noted, however, that prober adjustable points 26 and test head fixed rocker points 28 can be of any compatible size and shape that permits the movement of points 28 of test head 14 within adjustable points 26 of prober 20 (e.g., a partial spherical socket and ball arrangement).

FIG. 1 also includes an upward looking camera 16 which is used in some prior art probers for alignment of the tips of probe needles 8 and the lead pads on the initial die on wafer 4, or cassette of wafers, to be tested. To perform that function, camera 16 focuses on the tips of the probe needles and the prior art prober system, knowing the pattern of the lead pads on the die, transpose the image of the probe needle tips from camera 16. From that transposition step the probe system determines the adjustments that need to be made to the position of stage 2 to bring the needle tips and the lead pads into alignment.

In the present invention camera 16 performs a different function. Here camera 16 provides information to the system of the present invention in order to bring about planarization after docking of test head 14 and prober 20. What needs to be done is to determine the plane of the tips of probe needles 8 and to compare that plane with the plane of wafer 4 so that the plane of the probe needle tips can be changed to be parallel to the plane of the wafer by adjusting the height of adjustable points 26 and thereby changing the slope of probe card 6 and the tips of probe needles 8.

To provide that information to the system, after docking to test a new wafer 4, or cassette of wafers, as part of the auto-set operation, stage 2 is moved aside and upward looking camera 16 is positioned beneath probe needles 8 to measure the height of the tips of selected ones of probe needles 8 above camera 16. Since camera 16 has a very limited depth of field (e.g., 20–30 microns) the distance between camera 16 and the tip of each of the selected probe needles can be determined individually based on the position of the lens of camera 16 when focus is achieved. Data relative to each of those lens focus positions is delivered to the system controller together with the positional information of the probe needle that was measured.

Figure 3:
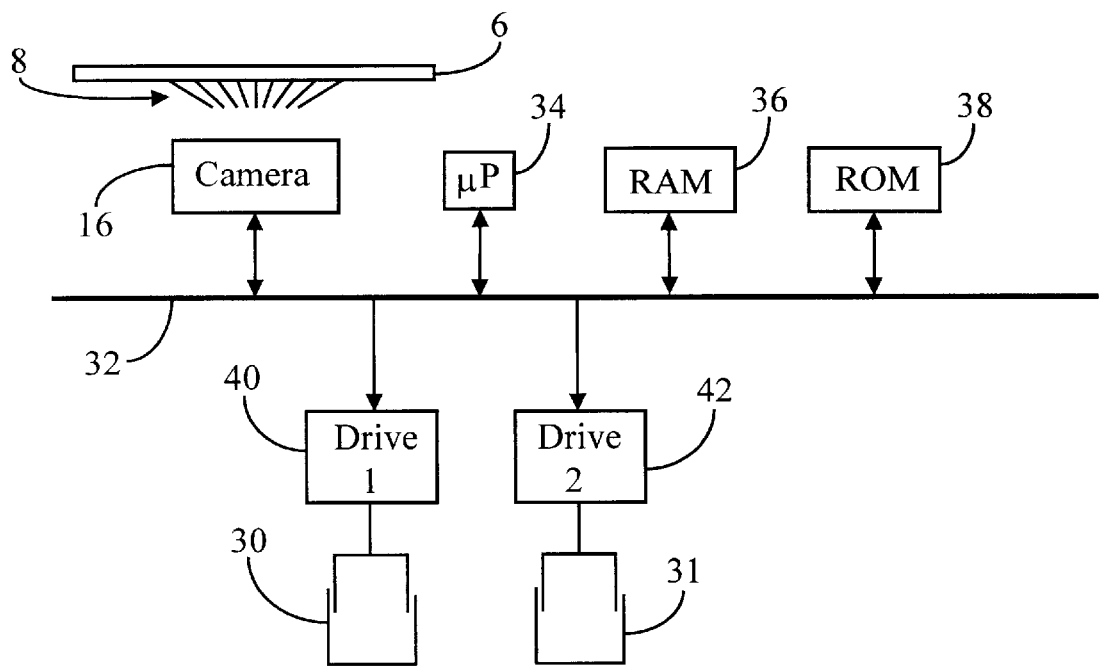
FIG. 3 is an electrical block diagram of the control elements of the present invention.

FIG. 3 is a block diagram of the system controller of the present invention to produce planarization between wafer 4 and probe card 6. Shown here is probe card 6 with probe needles 8 above camera 16 for measuring the height above camera 16 of selected ones of probe needles 8. Camera 16 in turn is connected to data bus 32 to automatically provide the height information of the selected probe needles to the system controller . That information is then transferred to RAM 36 where it is stored at least for the period of time that it takes $\mu$-processor 34 to calculate the necessary adjustments. ROM 38 is also connected to data bus 32 and severs as storage of the operational routines for the system and $\mu$-processor 34 which is also connected to data bus 32. Once the necessary adjustments are determined as will be seen in the discussion that follows, $\mu$-processor 34 causes control signals to be applied to drive 1 (40) and drive 2 (42) which in turn control lift actuators 30 and 31, respectively, to raise, lower, or hold in position, prober adjustable points 26 and test head rocker points 28 interfaced therewith. It should be noted that with a three point mounting system where only two of those points are adjustable, it may be necessary to adjust neither of those points, raise one and lower one, lower one, raise one, raise both, or lower both. If all three of the mounting points are adjustable, then any possible combination of raising, lowering or holding steady of those points may be necessary and there will generally be more than one possible combination to achieve the same effect. Given the typical tolerances and sizes of the various components of current tester heads, probers and wafers, the necessary throw of lift actuators 30 and 31 is in the range of 3–4 mm.

Figure 5:
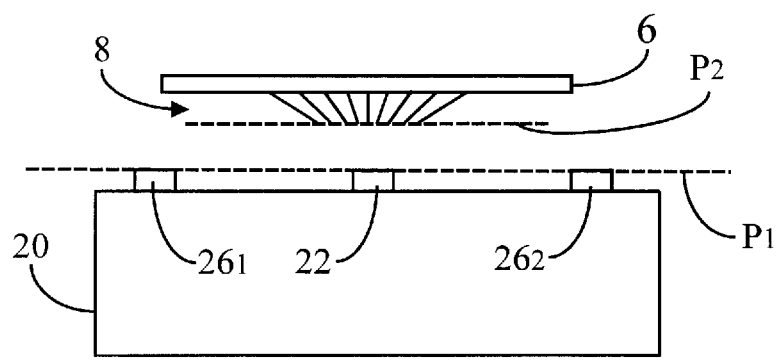
FIG. 5 is a simplified schematic side view of a prober and a probe card to illustrate the planes defined by the mounting points on the prober and the plane defined by the tips of the probe needles of the probe card.

Attention is now directed to FIG. 5 to illustrate the problem that needs to be solved in simplified form. Here there is shown prober 20 with fixed prober point 22 and prober adjustable points $26_1$ and $26_2$. Also there is shown probe card 6 with probe needles 8 extending toward prober 20 from probe card 6. From FIG. 5 it can be seen that the three points of fixed prober point 22 and prober adjustable points $26_1$ and $26_2$ define a first plane $P_1$. Similarly, tips of selected ones of probe needles 8 define a second plane $P_2$. To equalize the pressure between the various probe needles 8 and lead pads 44 (see FIG. 4) on a selected die on wafer 4, planes $P_1$ and $P_2$ have to be made substantially parallel to each other. That is accomplished by raising or lowering, as necessary, prober adjustable points $26^1$ and $26_2$ to make $P_1$ parallel to plane $P_2$ by raising or lowering, independently, each of test head rocker points 28 on test head 14 to which probe card 6 interfaces.

Figure 6:
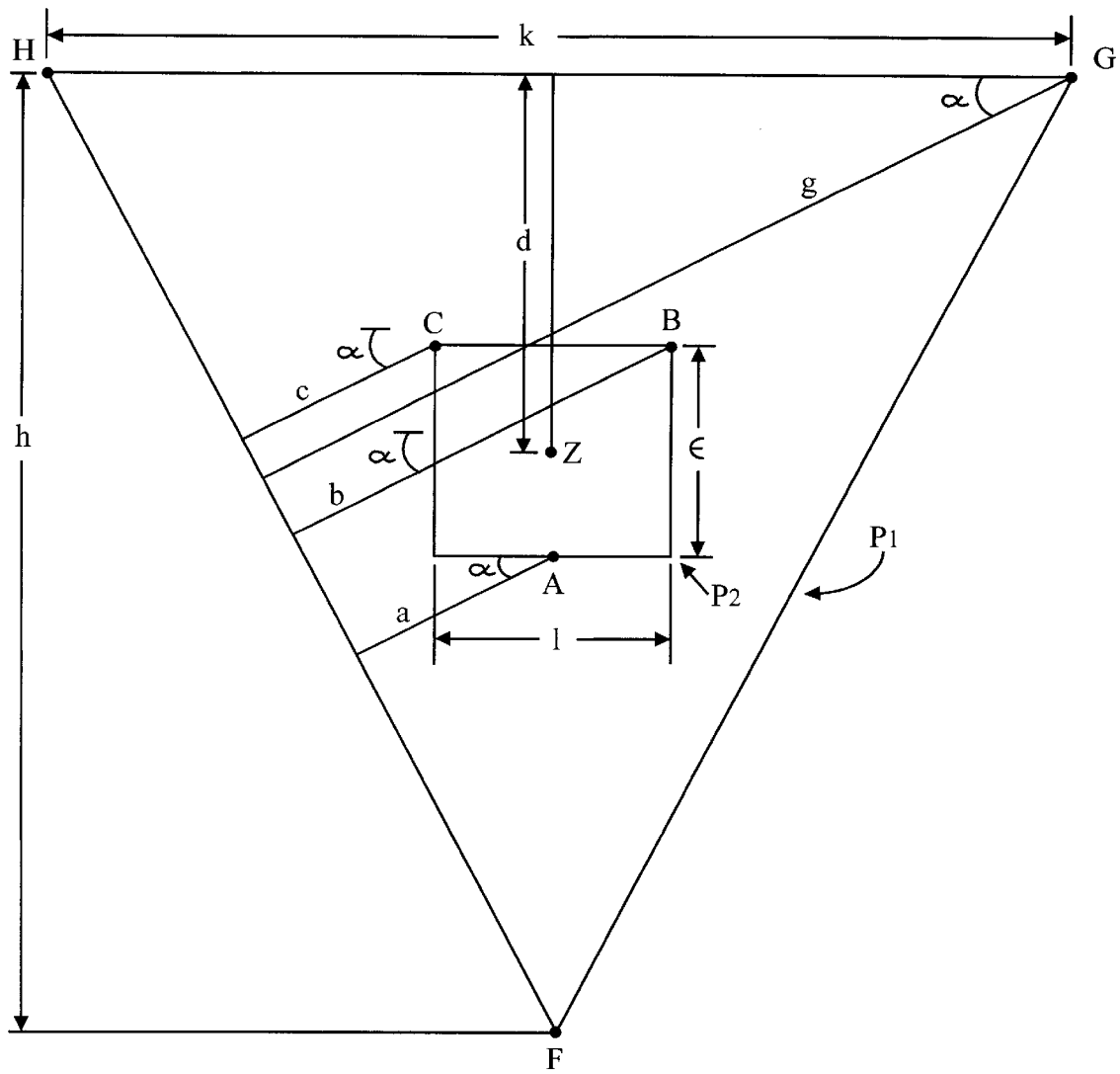
FIG. 6 is a top view of the prober and the probe card that illustrates the geometric relationship between the planes described with respect to FIG. 5 so that the calculations to bring the two planes into parallel orientation with respect to each other can be visualized.

Referring now to FIG. 6 plane $P_2$ is shown superimposed above plane $P_1$ with the extent of plane $P_2$ being smaller than that of plane $P_1$ since probe card 6 interfaces with only one of the die on wafer 4 that is mounted on stage 2 of prober 20. Also for purposes of illustration, the orientation of fixed prober point 22 (F) and adjustable prober points $26_1$ (G) and 262 (H) define a symmetrical triangle with the line between G and H forming the base and F forming the apex on plane $P_1$. Similarly, also for purposes of illustration, the tips of three probe needles 8 (A, B and C) define a symmetrical triangle with the line between B and C forming the base and A forming the apex of that triangle on plane $P_2$. Further, also for convenience of this discussion, the base lines of the two symmetrical triangles on each of planes $P_1$ and $P_2$ are shown being parallel to each other. It should be kept in mind, however, that this configuration with symmetric triangles with the base lines of each being parallel is not required to be able to calculate any needed variation in the height of prober adjustable points $26^1$ and $26^2$, it merely simplifies the necessary calculations to achieve the desired result for purposes of illustration. The more complex mathematics to operate with different configurations can certainly be determined.

As discussed above, camera 16 is moved beneath the selected probe needles 8 (A, B and C) and the distance between those tips and camera 16 is determined. Since the plane in which camera 16 travels is known, the difference in the height measured by camera 16 and fixed prober point 22 (F) and adjustable prober points $26_1$ (G) and $26^2$ (H) is either known or easily calculable by addition (i.e., point F is fixed so there is a fixed relationship to the plane of camera 16, and the height of points G and H is known relative to a fixed reference point on prober 20 with the difference in height between that reference point and the plane of camera 16 also being known). Thus for purposes of discussion here in the examples that follow, the measured height of points A, B and C are assumed to be the height above plane $P_1$ since those distances can be determined as explained above.

Before going on to the first example of the calculations of the positional changes needed of prober adjustable points $26_1$ and $26_2$ (G and H), some other necessary dimensions need to be introduced. In FIG. 6 for plane $P_2$, the length of the base line of the symmetrical triangle of the three probe needles is 1 (distance between B and C) and the height of that triangle is w (the distance between A and the base line of that triangle. For plane $P_1$, the length of the base line of the symmetrical triangle of the three prober points is k (distance between G and H) and the height of that triangle is h (the distance between F and the base line of that triangle. Further, assuming plane $P_2$ is projected onto plane $P_1$, the center of triangle ABC of plane $P_2$ is defined to be co-incident with the center of triangle FGH (Z) of plane $P_1$ with the distance d being the shortest distance between point Z and the base line (G–H) of the triangle of plane $P_1$ (d is also the sum of the distance between the base lines of the two triangles (lines B–C and line G–H) plus half the height of triangle ABC (½ w). Other values that will be necessary to calculate the necessary changes in the heights of G and H are g, the height of the triangle FGH taken from point G (length of the perpendicular line segment from G to line F–H); a, b and c, the shortest distance from each of probe needles A, B and C, respectively, to line F–H (length of the perpendicular line segments from each of needles A, B and C to line F–H); and α, the angle that each of lines a, b, c and g makes below the horizontal line associated with each of points A, B, C and G, respectively. Therefore once the desired probe needles 8 are selected and the distance measured by camera 16 between them and plane $P_1$, the values of w, l, d, k, h, A, B, C, g, a, b, c and a are fixed.

TABLE I

| Self Planarization Model | | |
|---|---|---|
| w = 12.7 | Inputs | |
| l = 25.4 | | |
| d = 400 | | |
| k = 900 | | |
| h = 1250 | | |
| A = 78.555 | Distance between wafer and probe tips | |
| B = 78.555 | | |
| C = 78.555 | | |
| $\alpha = \operatorname{atan}\left(\dfrac{k}{2 \cdot h}\right)$ | Angle between k and g | $\dfrac{180}{\pi} \cdot \alpha = 19.799$ |
| $g = k \cdot \cos(\alpha)$ | | g = 846.799 |
| $b = \dfrac{\left[\dfrac{k+l}{2} - \tan(\alpha) \cdot \left(d - \dfrac{w}{2}\right)\right] \cdot g}{k}$ | | b = 302.012 |
| $c = \dfrac{\left[\dfrac{k-l}{2} - \tan(\alpha) \cdot \left(d - \dfrac{w}{2}\right)\right] \cdot g}{k}$ | | c = 278.113 |
| $\Delta G = (C - B) \cdot \dfrac{g}{b - c}$ | Change of G to level B & C | ΔG = 0 |

TABLE I-continued

Self Planarization Model

| | | |
|---|---|---|
| $\Delta G = -2 \cdot (B - C) \cdot k^2 \cdot \dfrac{h}{\left[\sqrt{4 \cdot h^2 - k^2} \cdot (g \cdot l)\right]}$ | $\Delta G$ calculated using supporting points | |
| $a = \dfrac{\dfrac{k}{2} - \left(d - \dfrac{w}{2}\right) \cdot \tan(\alpha)}{k} \cdot g$ | | $a = 285.761$ |
| $\Delta A = \dfrac{\Delta G}{g} \cdot a$ | Change of distance between wafer and probe tips | $\Delta A = 0$ |
| $\Delta B = \dfrac{\Delta G}{g} \cdot b$ | | $\Delta B = 0$ |
| $\Delta C = \dfrac{\Delta G}{g} \cdot c$ | | $\Delta C = 0$ |
| $nA = A + \Delta A$<br>$nB = B + \Delta B$<br>$nC = C + \Delta C$ | New distance between wafer and probe tips | $nA = 78.555$<br>$nB = 78.555$<br>$nC = 78.555$ |
| $\delta GH = (nA - nB) \cdot \dfrac{h}{w}$ | Change G & H to planarize surfaces | $\delta GH = 0$ |
| $\delta A = \dfrac{\delta GH}{h} \cdot (h - d - w)$ | | $\delta A = 0$ |
| $\delta B = \dfrac{\delta GH}{h} \cdot (h - d)$ | | $\delta B = 0$ |
| NewA = nA + $\delta$A<br>NewB = nB + $\delta$B<br>NewC = nC + $\delta$B | New distance between wafer and probe tips | NewA = 78.555<br>NewB = 78.555<br>NewC = 78.555 |
| DeltaG = $\Delta$G + $\delta$GH<br>DeltaH = $\delta$GH<br>DeltaG = $\Delta$G + $\delta$GH | Global change of G & H to planarize surfaces | DeltaG = 0<br>DeltaH = 0 |

Thus, referring to Table I there are linear input values given for w, l, d, k and h which are either measured or calculated based on the spacing between A, B, C, F, G and H, and the symmetrical shape of each of the triangles in the two planes, and first measured height values are provided for A, B and C with them all being equal in this example (i.e., 78.555). The first calculation is for the angle $\alpha$. In the formula given in Table I that angle is calculated using the length of the base line (k) and height of triangle FGH (h) as:

$$\alpha = a\tan\dfrac{k}{2h} \; ; \; \dfrac{180}{\pi} \cdot \alpha = 19,799 \tag{1}$$

given the value of the angle $\alpha$, the length of g can be calculated as $$g = k \cdot \cos\alpha = 846.799 \tag{2}$$

next b, the distance from point B to line F–H is calculated $$b = \dfrac{\left[\dfrac{k+1}{2} - \tan(\alpha)\left[d - \dfrac{w}{2}\right]\right] \cdot g}{k} = 302.012 \tag{3}$$

next c, the distance from point C to line F–H is calculated $$c = \dfrac{\left[\dfrac{k-1}{2} - \tan(\alpha)\left[d - \dfrac{w}{2}\right]\right] \cdot g}{k} = 278.113 \tag{4}$$

With these results there is enough information to calculate the change in height of either of points G or H (prober adjustable points 26) needed to make line B–C of plane $P_2$ in the vertical plane parallel to plane $P_1$. For illustration, the necessary change in the height of point G has been selected. Thus, the needed change in the height of point G is calculated as follows:

$$\Delta G = (C - B) \cdot \dfrac{g}{b - c} = 0 \tag{5}$$

Alternatively, the necessary change in the height of point G could be calculated using the following formula:

$$\Delta G = 2 \cdot (C - B) \cdot k^2 \cdot \dfrac{h}{\left[\sqrt{(4 \cdot h^2 + k^2)} \cdot (g \cdot l)\right]} \tag{6}$$

Given the necessary change in the height of prober adjustable point G (26), to calculate the change in height of points A, B and C on probe card 6 the length lines a, b and c projected into the plane of the prober 20 are necessary, where lines a, b and c are each perpendicular to the line joining points F and H, as is line g from point G. Thus those formulas are:

$$a = \dfrac{\dfrac{k}{2} - \left[d + \dfrac{w}{2}\right] \cdot \tan(\alpha)}{k} \cdot g \tag{7a}$$

-continued $$b = \frac{\frac{k-1}{2} - \left[d + \frac{w}{2}\right] \cdot \tan(\alpha)}{k} \cdot g \quad (7b)$$

$$c = \frac{\frac{k+1}{2} - \left[d + \frac{w}{2}\right] \cdot \tan(\alpha)}{k} \cdot g \quad (7c)$$

For the present example, a=285.761, b=302.012 and c=278.113

To calculate the changes in the distance between probe tips 8 and wafer 4 at the points A, B and C resulting from the change in the height of G the following formulas are used:

$$\Delta A = \frac{\Delta G}{g} \cdot a \quad (8a)$$

$$\Delta B = \frac{\Delta G}{g} \cdot b \quad (8b)$$

$$\Delta C = \frac{\Delta G}{g} \cdot c \quad (8c)$$

where in this example $\Delta A=\Delta B=\Delta C=0$ and the new distance between probe tips 8 and wafer 4 at points A, B and C are calculated using the following formulas:

$$nA=A+\Delta A \; ; \; nB=B+\Delta B \; ; \; and \; nC=C+\Delta C \quad (9)$$

and in this example nA=nB=nC=78.555, the original values of A, B and C.

The next calculation that is needed when changes in the heights of G and H are needed is the change in G and H to planarize planes $P_1$ and $P_2$ is $$\delta GH = (nA - nB) \cdot \frac{h}{w} \quad (10)$$

which in this example $\delta GH=0$.

Next, the actual change in height of two points, A and B, in plane $P_2$ are calculated as follows:

$$\delta A = \frac{\delta GH}{h} \cdot (h - d - w) \quad (11a)$$

$$\delta B = \frac{\delta GH}{h} \cdot (h - d) \quad (11b)$$

Where for this example, $\delta A=\delta B=0$.

The new distances between points A, B and C among the probe tips 8 and wafer 4 (plane $P_2$) are calculated as follows:

$$\begin{aligned} New\; A &= nA+\delta A \\ New\; B &= nB+\delta \\ New\; C &= nC+\delta B \end{aligned} \quad (12)$$

where for the present example New A=New B=New C=78.555, the original values for A, B and C.

To calculate the global changes necessary, prober adjustable points 26 (G and H) are calculated as follows:

$$Delta\; G = \Delta G + \delta GH; \; and$$

$$Delta\; H = \delta GH \quad (13)$$

and for this example Delta G=Delta H=0, as was expected since A, B and C were equal when the calculations were started, thus no change is necessary since planes $P_1$ and $P_2$ were parallel to each other at the start.

TABLE II

| Self Planarization Model | | |
|---|---|---|
| w = 12.7 | Inputs | |
| l = 25.4 | | |
| d = 400 | | |
| k = 900 | | |
| h = 1250 | | |
| A = 78.555 | Distance between wafer and probe tips | |
| B = 78.555 | | |
| C = 78.555 | | |
| $\alpha = \text{atan}\left(\frac{k}{2 \cdot h}\right)$ | Angle between k and g | $\frac{180}{\pi} \cdot \alpha = 19.799$ |
| $g = k \cdot \cos(\alpha)$ | | g = 846.799 |
| $b = \dfrac{\left[\frac{k+1}{2} - \tan(\alpha) \cdot \left(d - \frac{w}{2}\right)\right] \cdot g}{k}$ | | b = 302.012 |
| $c = \dfrac{\left[\frac{k-1}{2} - \tan(\alpha) \cdot \left(d - \frac{w}{2}\right)\right] \cdot g}{k}$ | | c = 278.113 |
| $\Delta G = (C - B) \cdot \frac{g}{b - c}$ | Change of G to level B & C | $\Delta G = -0.354$ |
| $\Delta G = -2 \cdot (B - C) \cdot k^2 \cdot \dfrac{h}{\left[\sqrt{4 \cdot h^2 - k^2} \cdot (g \cdot l)\right]}$ | $\Delta G$ calculated using supporting points | |
| $a = \dfrac{\frac{k}{2} - \left(d - \frac{w}{2}\right) \cdot \tan(\alpha)}{k} \cdot g$ | | a = 285.761 |

TABLE II-continued

Self Planarization Model

| | | |
|---|---|---|
| $\Delta A = \frac{\Delta G}{g} \cdot a$ | Change of distance between wafer and probe tips | $\Delta A = -0.12$ |
| $\Delta B = \frac{\Delta G}{g} \cdot b$ | | $\Delta B = -0.126$ |
| $\Delta C = \frac{\Delta G}{g} \cdot c$ | | $\Delta C = -0.116$ |
| nA = A + ΔA | New distance between wafer and probe tips | nA = 78.435 |
| nB = B + ΔB | | nB = 78.439 |
| nC = C + ΔC | | nC = 78.439 |
| $\delta GH = (nA - nB) \cdot \frac{h}{w}$ | Change G & H to planarize surfaces | $\delta GH = -0.315$ |
| $\delta A = \frac{\delta GH}{h} \cdot (h - d - w)$ | | $\delta A = -0.211$ |
| $\delta B = \frac{\delta GH}{h} \cdot (h - d)$ | | $\delta B = -0.214$ |
| NewA = nA + δA | New distance between wafer and probe tips | NewA = 78.224 |
| NewB = nB + δB | | NewB = 78.224 |
| NewC = nC + δB | | NewC = 78.224 |
| DeltaG = ΔG + δGH | Global change of G & H to planarize surfaces | DeltaG = −0.669 |
| DeltaH = δGH | | DeltaH = −0.315 |
| DeltaG = ΔG + δGH | | |

A second example is presented in Table II where point B in plane $P_2$ is further from plane $P_1$ than are points A and C which are the same distance from plane $P_1$ in the first example. The formulas and the intermediate results for this example are shown in Table II with the resultant changes in G and H necessary to make plane $P_2$ parallel with plane $P_1$ are that G must be lowered by 0.669 units and H must be lowered by 0.315 units. Looking at FIG. 6 it can be seen that if point B is higher above the plane of points F, G and H, and since the height of only points G and H can be varied, then point G must be lowered more than point H since point B is closer to point G than it is to point H.

TABLE III

Self Planarization Model

| | | |
|---|---|---|
| w = 12.7 | Inputs | |
| l = 25.4 | | |
| d = 400 | | |
| k = 900 | | |
| h = 1250 | | |
| A = 145.055 | Distance between wafer and probe tips | |
| B = 145.140 | | |
| C = 145.045 | | |
| $\alpha = \operatorname{atan}\left(\frac{k}{2 \cdot h}\right)$ | Angle between k and g | $\frac{180}{\pi} \cdot \alpha = 19.799$ |
| $g = k \cdot \cos(\alpha)$ | | g = 846.799 |
| $b = \frac{\left[\frac{k+1}{2} - \tan(\alpha) \cdot \left(d - \frac{w}{2}\right)\right] \cdot g}{k}$ | | b = 302.012 |
| $c = \frac{\left[\frac{k-1}{2} - \tan(\alpha) \cdot \left(d - \frac{w}{2}\right)\right] \cdot g}{k}$ | | c = 278.113 |
| $\Delta G = (C - B) \cdot \frac{g}{b - c}$ | Change of G to level B & C | $\Delta G = -3.366$ |
| $\Delta G = -2 \cdot (B - C) \cdot k^2 \cdot \frac{h}{\left[\sqrt{4 \cdot h^2 - k^2} \cdot (g \cdot l)\right]}$ | ΔG calculated using supporting points | |

TABLE III-continued

Self Planarization Model

| | | |
|---|---|---|
| $a = \dfrac{\dfrac{k}{2} - \left(d + \dfrac{w}{2}\right) \cdot \tan(\alpha)}{k} \cdot g$ | | $a = 285.761$ |
| $\Delta A = \dfrac{\Delta G}{g} \cdot a$ | Change of distance between wafer and probe tips | $\Delta A = -1.136$ |
| $\Delta B = \dfrac{\Delta G}{g} \cdot b$ | | $\Delta B = -1.201$ |
| $\Delta C = \dfrac{\Delta G}{g} \cdot c$ | | $\Delta C = -1.106$ |
| $nA = A + \Delta A$<br>$nB = B + \Delta B$<br>$nC = C + \Delta C$ | New distance between wafer and probe tips | $nA = 143.919$<br>$nB = 143.939$<br>$nC = 143.939$ |
| $\delta GH = (nA - nB) \cdot \dfrac{h}{w}$ | Change G & H to planarize surfaces | $\delta GH = -2.008$ |
| $\delta A = \dfrac{\delta GH}{h} \cdot (h - d - w)$ | | $\delta A = -1.345$ |
| $\delta B = \dfrac{\delta GH}{h} \cdot (h - d)$ | | $\delta B = -1.365$ |
| NewA = nA + δA<br>NewB = nB + δB<br>NewC = nC + δB | New distance between wafer and probe tips | NewA = 145.574<br>NewB = 145.574<br>NewC = 145.574 |
| DeltaG = ΔG + δGH<br>DeltaH = δGH<br>DeltaG = ΔG + δGH | Global change of G & H to planarize surfaces | DeltaG = −5.374<br>DeltaH = −2.008 |

In the third example, each of points A, B and C are at a different height with respect to plane $P_1$, the plane of points F, G and H, with point B being the furthest above plane $P_1$, point C being the closest to plane $P_1$, and point A being at a height intermediate points B and C. As can be seen from the calculations in Table III for ΔA, ΔB and ΔC, B is to be lowered the most, and C the least with A at a value intermediate the other two, just as with the original differences in heights. Then further down in Table III the amounts by which points G and H must be changed in this example are given.

Figure 2B:
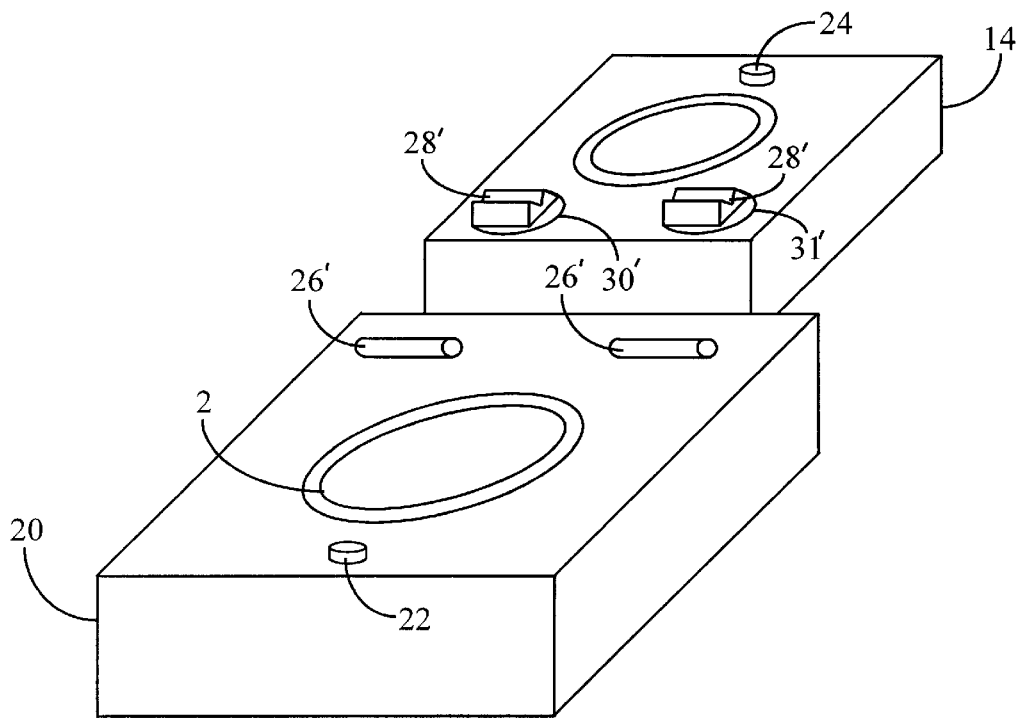
Figure 2C:
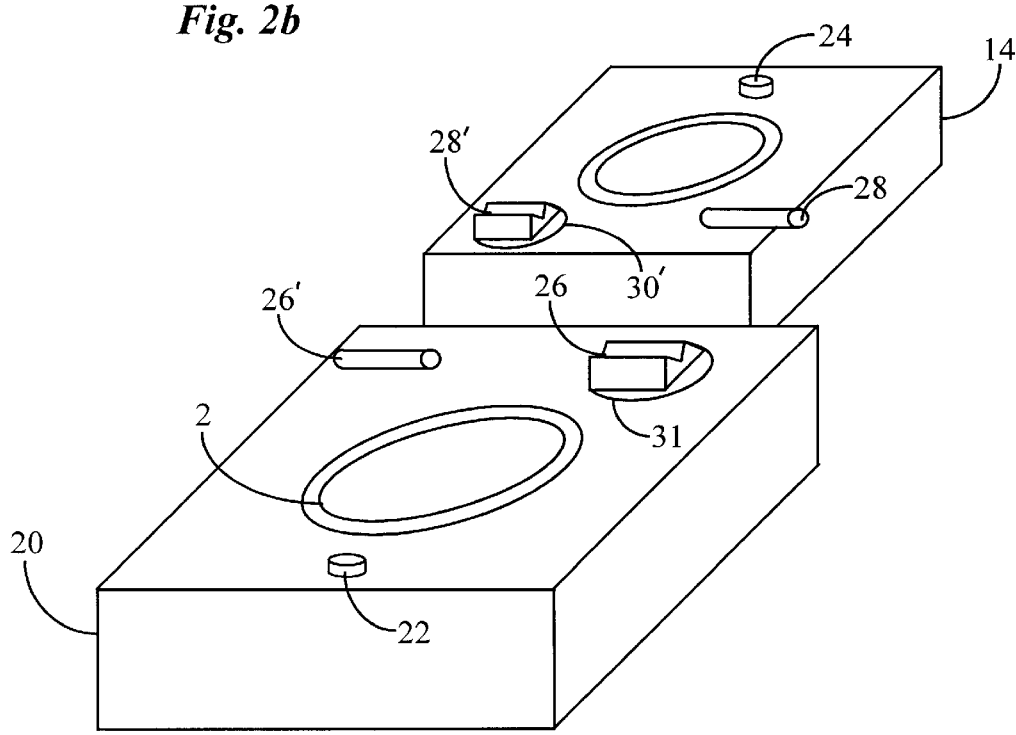
Figure 2D:
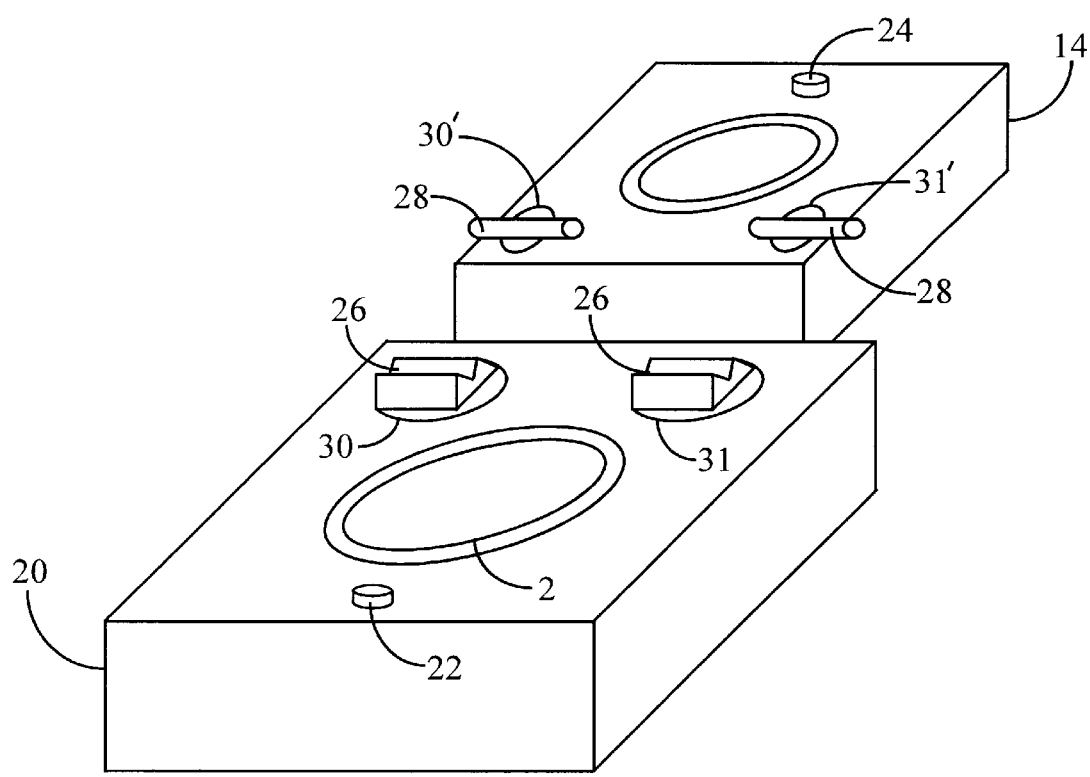

In the alternative, both height adjustments could be provided in the tester assembly as shown in FIG. 2b with prober rocker points 26' being fixed and shown as cylindrical rod sections affixed to prober 20, and test head adjustable points 28' being "V" shaped saddles attached to lift actuators 30' and 31' and shaped to mate with the rod sections. Yet another alternative is to provide one height adjustment in each of the prober and the tester as shown in FIG. 2c with prober 20 having one adjustable "V" shaped saddle 26 affixed to lift actuator 31 and one fixed rocker point 26' shown as a cylindrical rod section, and with test head 14 having one fixed rocker point 28 shown as a cylindrical rod section that is disposed to mate with "V" shaped saddle 26 and an adjustable "V" shaped saddle 30' that is affixed to lift actuator 30' and disposed to mate with rod section 26'. Still another alternative is to provide a portion of the height adjustment at one or more points in both the prober and the tester as shown in FIG. 2d with prober 20 including two adjustable "V" shaped saddles affixed to lift actuators 30 and 31, respectively, as originally shown in FIG. 2a, and the tester includes two cylindrical rod sections 28 affixed to lift actuators 30' and 31', respectively, to permit heigh adjustment by one, two, three or all four of support points 26 and 28.

Although the descriptions above primarily discuss the use of present generation devices and implementation techniques, some specific technologies involved in the preferred embodiment of the present invention are expected to change as time evolves. Further, as will be understood by those familiar with the art, the present invention may be embodied in other specific forms without departing from the spirit or essential characteristics thereof. The scope of the present invention therefore in its full interpretation is only to be limited by the scope of the claims appended hereto.

What is claimed is:

1. A method for automatically planarizing a first plane defined by a plurality of contact points of a probe card relative to a second plane defined by a top surface of a wafer supported on a prober, and said probe card intermediate said wafer and a tester with said probe card interfacing electrically with said tester to test the performance of said wafer, said method comprising the steps of:

a. interfacing said probe card to said wafer;

b. interfacing a first fixed point on said prober with a first fixed point on said tester;

c. interfacing, individually, second and third support points on said prober to second and third support points on said prober;

d. measuring a height of at least three selected contact points on said probe card relative to said second plane of said wafer;

e. calculating the position of said first plane relative to said second plane utilizing the results of step d.;

f. calculating height variations between said second and third support points on each of said prober and tester needed to planarize said first plane relative to said second plane utilizing the results of step e. and the geometry of said prober and tester as interfaced; and g. altering the height of the interface between said second and third support points on said prober and said tester, as necessary, in response to the results of step f.

2. A method as in claim 1 wherein:
said second and third support points on said prober are adjustable height support points;
said second and third support points on said tester are fixed support points;
in step f. the height variations calculated are for said second and third support points on said prober; and
in step g. the height of said second and third support points on said prober are altered.

3. A method as in claim 1 wherein:
said second and third support points on said tester are adjustable height support points;
said second and third support points on said prober are fixed support points;
in step f. the height variations calculated are for said second and third support points on said tester; and
in step g. the height of said second and third support points on said tester are altered.

4. A method as in claim 1 wherein:
said second support point on said tester is a fixed support point;
said third support point on said tester is an adjustable height support point;
said third support point on said prober is a fixed support point;
said second support point on said prober is an adjustable height support point;
in step f. the height variations calculated are for said second support point of said prober and said third support point of said tester; and
in step g. the height of said second support point of said prober and said third support point of said tester are altered.

5. A method as in claim 1 wherein:
said second and third support points of said tester and prober are all adjustable height support points;
in step f. the height variations are calculated for the interfaces between said second and third support points of both said prober and said tester; and
in step g. the height of each of said second and third support points of said prober and said tester are all altered as necessary.

6. An automatic probe card planarization system to planarize a first plane defined by a plurality of contact points of a probe card relative to a second plane defined by a top surface of a wafer supported on a prober, and said probe card intermediate said wafer and a tester with said probe card interfacing electrically with said tester to test the performance of said wafer, said system comprising:
a processor to determine positions of said first and second planes relative to each other and to calculate a correction necessary to substantially planarize said first and second planes;
said prober including:
a first support point;
first and second adjustable height support points; and
first and second variable height controllers coupled to said first and second adjustable height support points, respectively, to vary the height thereof in response to signals from said processor;
a measurement device in a fixed relationship to said top surface of said wafer to measure the height of at least three selected contact points on said probe card relative to said top surface of said wafer and to provide said contact heights to said processor to determine said first plane relative to said second plane; and
said tester including:
a second support point to interface with said first support point of said prober; and
third and fourth support points to individually interface with a corresponding one of said first and second adjustable height support points of said prober to alter the position of said first plane relative to said second plane as the height of said first and second adjustable support points of said prober is varied by said processor.

7. An automatic probe card planarization system as in claim 6 wherein said measurement means is a camera.

8. An automatic probe card planarization system to planarize a first plane defined by a plurality of contact points of a probe card relative to a second plane defined by a top surface of a wafer supported on a prober, and said probe card intermediate said wafer and a tester with said probe card interfacing electrically with said tester to test the performance of said wafer, said system comprising:
a processor to determine positions of said first and second planes relative to each other and to calculate a correction necessary to substantially planarize said first and second planes;
said tester including:
a first support point;
first and second adjustable height support points; and
first and second variable height controllers coupled to said first and second adjustable height support points, respectively, to vary the height thereof in response to signals from said processor;
a measurement device in a fixed relationship to said top surface of said wafer to measure the height of at least three selected contact points on said probe card relative to said top surface of said wafer and to provide said contact heights to said processor to determine said first plane relative to said second plane; and
said prober including:
a second support point to interface with said first support point of said tester; and
third and fourth support points to individually interface with a corresponding one of said first and second adjustable height support points of said tester to alter the position of said first plane relative to said second plane as the height of said first and second adjustable support points of said tester is varied by said processor.

9. An automatic probe card planarization system as in claim 8 wherein said measurement device is a camera.

10. An automatic probe card planarization system to planarize a first plane defined by a plurality of contact points of a probe card relative to a second plane defined by a top surface of a wafer supported on a prober, and said probe card intermediate said wafer and a tester with said probe card interfacing electrically with said tester to test the performance of said wafer, said system comprising:
a processor to determine positions of said first and second planes relative to each other and to calculate a correction necessary to substantially planarize said first and second planes;
said tester including:
first and second support points;
a third adjustable height support point; and a first variable height controller coupled to said third adjustable height support point to vary the height thereof in response to signals from said processor;

a measurement device in a fixed relationship to said top surface of said wafer to measure the height of at least three selected contact points on said probe card relative to said top surface of said wafer and to provide said contact heights to said processor to determine said first plane relative to said second plane; and said prober including:

first and third support points to interface with said first and third support points, respectively, of said tester;

a second adjustable height support point to interface with said second support point of said tester; and a second variable height controller coupled to said second adjustable height support point to vary the height thereof in response to signals from said processor;

wherein said first and second variable height controllers, under control of said processor, alter the position of said first plane relative to said second plane as the height of said first and second adjustable support points of said tester is varied by said processor.

11. An automatic probe card planarization system as in claim 10 wherein said measurement device is a camera.

* * * * *